United States Patent [19]
Oh

[11] Patent Number: 5,287,308
[45] Date of Patent: Feb. 15, 1994

[54] UNDERSHOOT RESISTING INPUT CIRCUIT FOR SEMI-CONDUCTOR DEVICE

[75] Inventor: Jong H. Oh, Ichonkun, Rep. of Korea

[73] Assignee: Hyundai Electronics Industries Co., Ltd., Ichonkun Kyoungkido, Rep. of Korea

[21] Appl. No.: 717,986

[22] Filed: Jun. 20, 1991

[30] Foreign Application Priority Data

Jun. 27, 1990 [KR] Rep. of Korea .................. 1990-9579

[51] Int. Cl.⁵ ............................................. G11C 7/00
[52] U.S. Cl. ............................ 365/189.06; 365/206
[58] Field of Search ........................... 307/540, 548; 365/189.06, 206, 228

[56] References Cited

U.S. PATENT DOCUMENTS 4,678,941  7/1987  Chao et al. .................. 365/230.06 X Primary Examiner—Steven Mottola
Attorney, Agent, or Firm—Darby & Darby

[57] ABSTRACT

An undershoot resisting input circuit for a semi-conductor device having a first terminal for a power supply, a second terminal for an external input, and an internal holding node in the semiconductor device, comprising a p-channel MOSFET having a gate connected to receive an address input signal and a source connected to the first terminal, a first n-channel MOSFET having a gate connected to receive the address input signal, a drain connected to the drain of the p-channel MOSFET and a source connected to the second terminal, a second n-channel MOSFET having a gate connected to the drain of the p-channel MOSFET and a drain connected to the second terminal, an inverter for inverting the address input signal, and a third n-channel MOSFET having a gate connected to an output terminal of the inverter, a drain connected to the source of the second n-channel MOSFET and a source connected to the internal holding node. The undershoot resisting input circuit according to the present invention prevents misoperation which may result from the undershoot of the external input, thereby assuring high reliability of a device incorporating this circuit.

2 Claims, 3 Drawing Sheets

UNDERSHOOT RESISTING INPUT CIRCUIT FOR SEMI-CONDUCTOR DEVICE

BACKGROUND OF THE INVENTION

1. Field of the Invention

The present invention relates in general to an input circuit for a semi-conductor device, and more particularly to an undershoot resisting input circuit for a semi-conductor device wherein a high voltage of an external input previously applied to the device is isolated and held with no loss at an internal holding node in the device even though the external input is undershot below a ground voltage when it is isolated from the device.

2. Description of the Prior Art

Generally, in the even that a compatible transistor logic (TTL) is employed as external input means for a semi-conductor device, the data specification for all products prescribes for the criteria of an input low voltage that an external input to the device may be undershot at a voltage lower than a ground voltage for a certain period of time. Namely, in a case of 1M dynamic RAM (DRAM) it is allowed that the external input is undershot at −1 V for a time period not exceeding 20 ns and in another case of that it is also allowed that the external input is undershot at −3 V during a time period not exceeding 10 ns.

A conventional input circuit for a semi-conductor device, as shown in FIG. 1, comprises a n-channel MOSFET MT and a parasitic capacitor CL connected to an internal holding node an in the semi-conductor device.

The n-channel MOSFET MT has a gate for inputting an address input signal ΦAI, a drain connected to an external input An for the semi-conductor device and a source connected to the internal holding node an.

In operation, if the address input signal ΦAI is high with respect to a power supply Vcc, the n-channel MOSFET MT is turned on, thereby enabling the external input An to be transferred to the internal holding node an. The external input An has a value no lower than 2.4 V, or the minimum value of an input high voltage of the TTL. It is also assumed that the external input An is regarded as a high state in a buffer circuit in the semi-conductor device.

When the address input signal ΦAI goes low, the n-channel MOSFET MT is turned off, thereby causing the internal holding node an in the semi-conductor device to be isolated from the external input An, so as to prevent external noise from incoming thereinto. At this time, the high voltage of the external input An previously transferred is held at the internal holding node an due to charges on the parasitic capacitor CL. Supposing that the external input An is undershot at −3.0 V, a gate-source voltage of the n-channel MOSFET MT is 3 V (VGS=VG−VS=0−(−3)) enabling the n-channel MOSFET MT to be turned on, thereby causing the internal holding node an to be connected to the external input An. This connection of the internal holding node an to the external input An causes the high voltage held at the internal holding node an to be lost and thus results in a mis-operation of the semi-conductor device.

A conventional undershoot resisting input circuit, as shown in FIG. 2, has been employed in the semi-conductor device as a means for preventing the loss of the voltage at the internal holding node due to the external noise in question in the above-mentioned conventional input circuit.

The conventional undershoot resisting input circuit as shown in FIG. 2 has been employed for a 1M DRAM available from TOSHIBA Co., Ltd.

The conventional undershoot resisting input circuit comprises n-channel MOSFETs M1 to M3 and capacitors C1 and C2.

The n-channel MOSFETs M2 and M3 are connected in series to each other between the external input An and the internal holding node an and include a common gate for inputting the address input signal ΦAI. One end of the capacitor C1 is connected to the power supply Vcc and the other end is connected to a common node 1 of the n-channel MOSFETs M2 and M3. The common node 1 is formed by the connection of a source of the n-channel MOSFET M2 with a drain of the n-channel MOSFET M3. On the other hand, one end of the capacitor C2 is connected to the power supply Vcc and the other end is connected to the internal holding node an. A gate of the n-channel MOSFET M1 is connected to the internal holding node an, a drain thereof is connected to the power supply Vcc and a source thereof is connected to the common node 1 of the n-channel MOSFETs M2 and M3.

In operation, if the external input An becomes high or 2.4 V or more during a time period that the address input signal ΦAI is high, the n-channel MOSFETs M2 and M3 are turned on, thereby causing the internal holding node an to become high. When the address input signal ΦAI goes low under the condition that the internal holding node an holds its high state, the n-channel MOSFETs M2 and M3 are turned off, thereby causing the internal holding node an to be isolated from the external input An, so as to prevent an external noise from incoming thereinto. As a result, the internal holding node an holds its high state. On the other hand, supposing that the external input An is undershot by up to −3 V, a gate-source voltage of the n-channel MOSFET M2 is 3 V (VGS=VG−VS=0 (−3)) enabling the n-channel MOSFET M2 to be turned on, thereby causing the common node 1 of the n-channel MOSFETs M2 and M3 to discharge. This discharging of the common node 1 of the n-channel MOSFETs M2 and M3 is subject to a resistance which results from a delaying effect of the capacitor C1 and an inflow of a charging current through the n-channel MOSFET M1 turned on depending on the high voltage at the internal holding node an. Since the discharging of the common node 1 due to the undershoot of the external input occurring during a certain time period is not sufficient, the n-channel MOSFET M3 is prevented being turned on and the loss of the high voltage at the internal holding node an is thus prevented. The coupling of the capacitor C2 between the gate and the source of the n-channel MOSFET M1 turned on during the discharging of the common node 1 of the n-channel MOSFETs M2 and M3 has the effect of preventing a voltage drop across the internal holding node an.

However, the conventional undershoot resisting input circuit has a disadvantage, in that a leakage current is caused by the series connection of the n-channel MOSFETS M2 and M3 during the undershoot of the external input. The conventional undershoot resisting input circuit has another disadvantage, in that the connection of the capacitor C2 to the internal holding node an results in an increase in load capacitance during the undershoot of the external input.

SUMMARY OF THE INVENTION

Therefore, it is an object of the present invention to provide an undershoot resisting input circuit for a semiconductor device for preventing a leakage current from being caused during an undershoot of an external input and also preventing a load capacitance from being increased during the undershoot of the external input, so that a high voltage of the external input previously applied to the device is held with no loss at an internal holding node in the device even though the external input is undershoot below a ground voltage when it is isolated from the device.

In accordance with the present invention, the object can be accomplished by providing an undershoot resisting input circuit for a semi-conductor device comprising: a p-channel MOSFET including a gate for inputting an address input signal and a source connected to a power supply; a first n-channel MOSFET including a gate for inputting the address input signal, a drain connected to said drain of said p-channel MOSFET and a source connected to an external input; a second n-channel MOSFET including a gate connected to said drain of said p-channel MOSFET and a drain connected to said external input; an inverter for inputting the address input signal; and a third n-channel MOSFET including a gate connected to an output of said inverter, a drain connected to a source of said second n-channel MOSFET and a source connected to an internal holding node in the semi-conductor device.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 1:
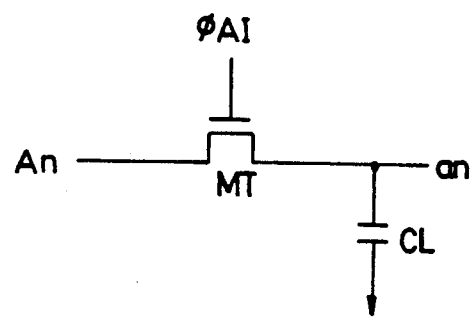
FIG. 1 is a schematic diagram of a conventional input circuit for a semi-conductor device.
Figure 2:
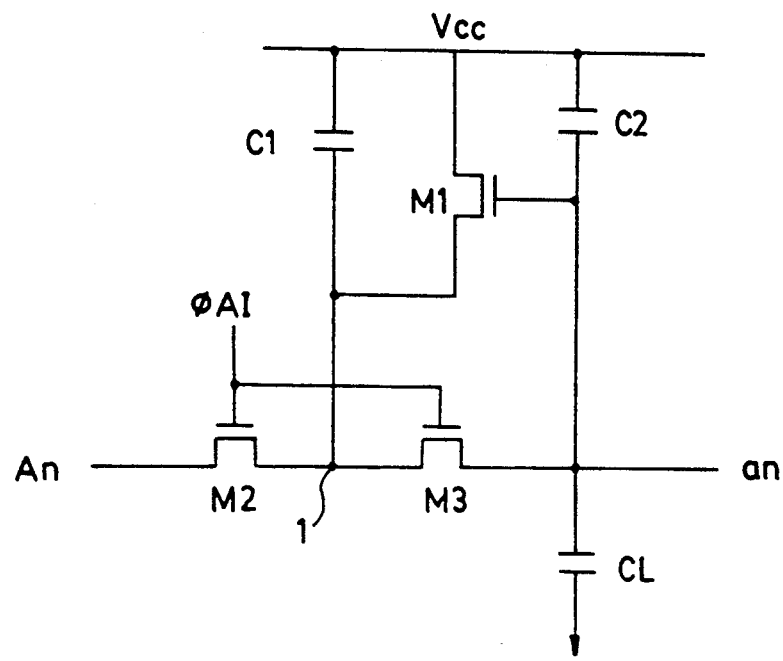
FIG. 2 is a detailed diagram of a conventional undershoot resisting input circuit for a semi-conductor device.
Figure 3:
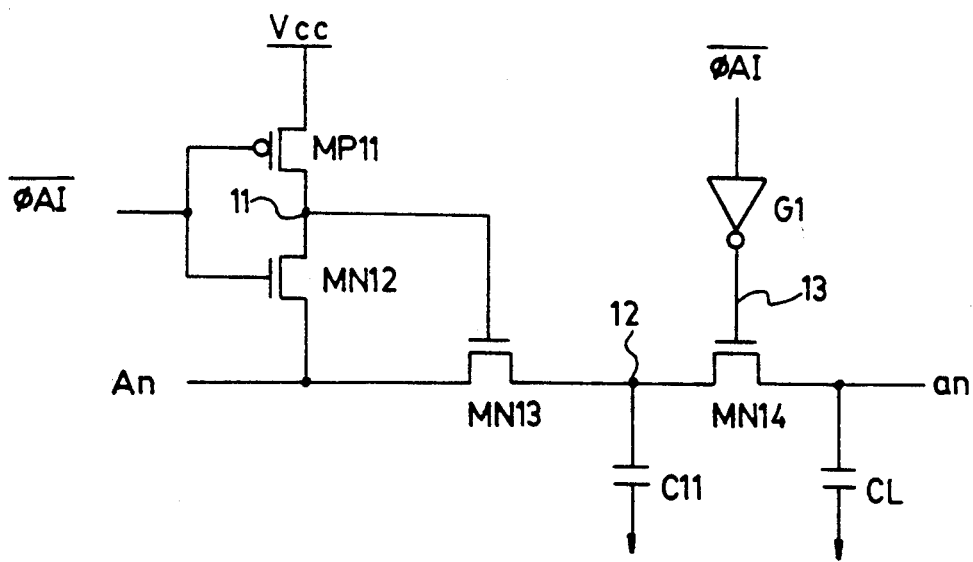
FIG. 3 is a detailed diagram of an undershoot resisting input circuit for a semi-conductor device according to the present invention.
Figure 4:
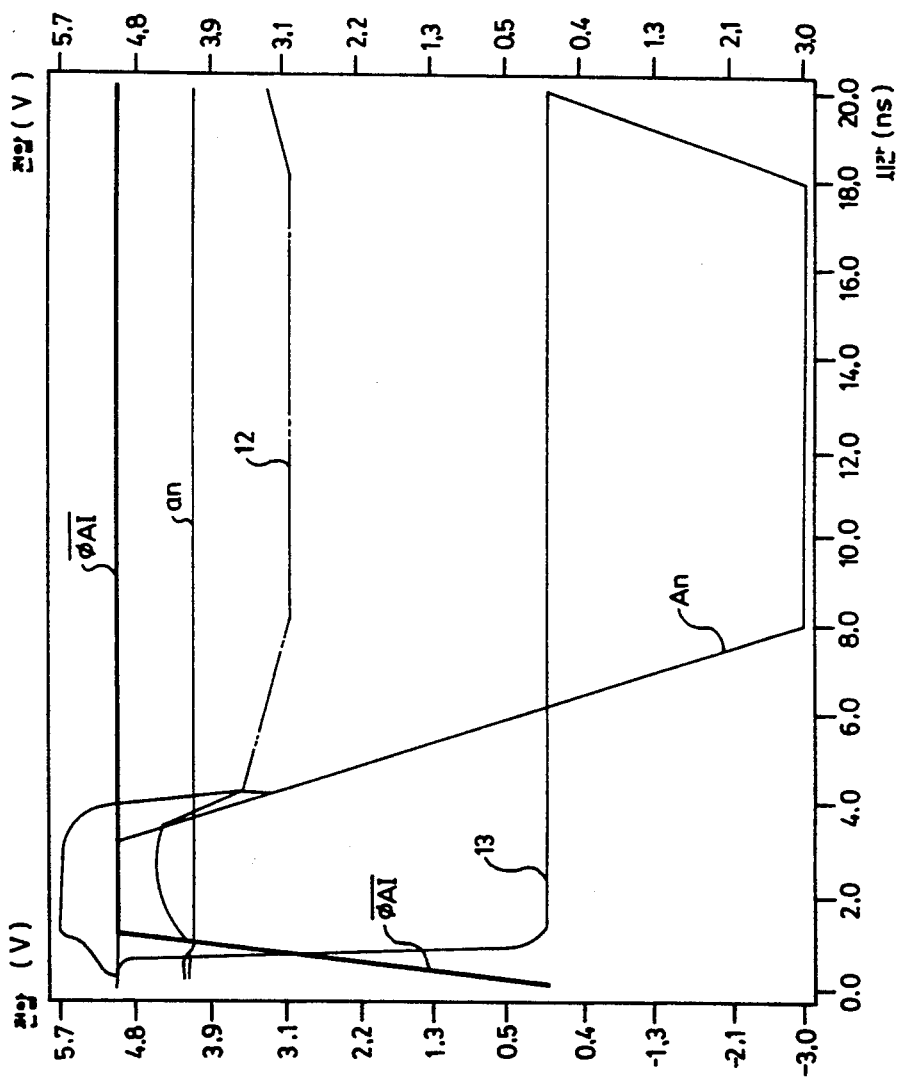
FIG. 4 is a signal waveform diagram illustrating a simulated result based on FIG. 3.

FIG. 3 is a detailed diagram of an undershoot resisting input circuit for a semi-conductor device according to the present invention and FIG. 4 is a signal waveform diagram illustrating a simulated result based on FIG. 3. In these drawings, the reference numeral MP11 designates a p-channel MOSFET, MN12 to MN14 n-channel MOSFETS, G1 an inverter, C11 a capacitor and CL a parasitic capacitor, respectively.

First, a construction of the undershoot resisting input circuit according to the present invention will be described with reference to FIG. 3.

Referring to FIG. 3, the undershoot resisting input circuit according to the present invention is shown to comprise a p-channel MOSFET MP11 including a gate for inputting an address input signal $\Phi AI$ and a source connected to a power supply Vcc, a n-channel MOSFET MN12 including a gate for inputting the address input signal $\Phi AI$, a drain connected to a drain of the p-channel MOSFET MP1 and a source connected to an external input An, and a n-channel MOSFET MN13 including a gate connected to a common drain node 11 of the p-channel MOSFET MP11 and the n-channel MOSFET MN12 and a drain connected to the external input An. The common drain node 11 is formed by the connection of the drain of the p-channel MOSFET MP11 with the drain of the n-channel MOSFET MN12.

Also, the undershoot resisting input circuit according to the present invention comprises an inverter G1 for inputting the address input signal $\Phi AI$, a n-channel MOSFET MN14 including a gate connected to an output 13 of the inverter G1, a drain connected to a source of the n-channel MOSFET MN13 and a source connected to an internal holding node an in the semi-conductor device, and a capacitor C11 including one end connected to a common node 12 of the n-channel MOSFETs MN13 and MN14 and the other end connected to a ground. The common node 12 is formed by the connection of the source of the n-channel MOSFET MN13 with the drain of the n-channel MOSFET MN14.

Next, the operation of the undershoot resisting input circuit with the above-mentioned construction according to the present invention will be described in detail.

First, if the address input signal $\Phi AI$ is low, the p-channel MOSFET MP11, the gate of which inputs the low address input signal $\Phi AI$, is turned on. Thus, the power from the power supply Vcc is applied to the gate of the n-channel MOSFET MN13 via the source and the drain of the p-channel MOSFET MP11, thereby enabling the n-channel MOSFET MN13 to be turned on. On the other hand, because the output 13 of the inverter G1 adapted for inputting the low address input signal $\Phi AI$ is high, the n-channel MOSFET MN14 is turned on. The turning-on of the series connected n-channel MOSFETs MN13 and MN14 allows the external input An to be transferred to the internal holding node therethrough.

When the address input signal $\Phi AI$ goes high, the p-channel MOSFET MP11 is turned off and the n-channel MOSFET MN12 is turned on, thereby allowing the external input An to be transferred to the common drain node 11 of the p-channel MP11 and the n-channel MOSFET MN12. For this reason, the n-channel MOSFET MN13 functions as a diode including an anode connected to the external input An and a cathode connected to the common node 12 of the n-channel MOSFETs MN13 and MN14. This diode function allows the n-channel MOSFET MN13 to almost maintain its off state even though the external input An is undershot by up to $-3$ V. As a result, a very small amount of the discharging of the common node 12 is performed through the n-channel MOSFET MN13. On the other hand, the high address input signal $\Phi AI$ is inverted by the inverter G1 and then applied to the gate of the n-channel MOSFET MN14. The n-channel MOSFET MN14 is turned off since the very small amount of the discharging of the common node 12 is performed through the n-channel MOSFET MN13 and the gate of MOSFET MN14 has the low-inverted address input signal $\Phi AI$ applied. As a result, the internal holding node an is isolated from the n-channel MOSFET MN14, thereby assuring the security of the holding state at the internal holding node an. Also, a voltage drop due to a discharging current generated through the n-channel MOSFET MN13 is delayed by the capacitor C11 having a small capacitance.

As hereinbefore described, in accordance with the present invention, the high voltage of the external input previously applied to the semi-conductor device is held with no loss at the internal holding node in the device even though the external input is undershot below a ground voltage when the undershoot resisting input circuit is isolated from the external input. Therefore, the undershoot resisting input circuit according to the present invention can prevent a mis-operation resulting from the undershoot of the external input, so as to assure its high reliability. The undershoot resisting input circuit according to the present invention may be applied to an address input buffer and a data input buffer.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An undershoot resisting input circuit for a semiconductor device having a first terminal for a power supply, a second terminal for an external input, and an internal holding node in the semiconductor device, comprising:

a p-channel MOSFET having a gate connected to receive an address input signal, a source connected to the first terminal, and a drain;

a first n-channel MOSFET having a gate connected to receive the address input signal, a drain connected to said drain of said p-channel MOSFET, and a source connected to the second terminal;

a second n-channel MOSFET having a gate connected to said drain of said p-channel MOSFET, a drain connected to the second terminal, and a source;

an inverter for inverting the address input signal, said inverter having an output terminal; and a third n-channel MOSFET having a gate connected to said output terminal of said inverter, a drain connected to said source of said second n-channel MOSFET, and a source connected to the internal holding node.

2. An undershoot resisting input circuit for a semiconductor device as in claim 1, further comprising a capacitor having one end connected to said source of said second n-channel MOSFET and the other end connected to ground, said capacitor delaying any voltage drop resulting from a discharge current flowing through said second n-channel MOSFET.

* * * * *